United States Patent
Du

(10) Patent No.: US 9,583,473 B2
(45) Date of Patent: *Feb. 28, 2017

(54) COMPLETE SYSTEM-ON-CHIP (SOC) USING MONOLITHIC THREE DIMENSIONAL (3D) INTEGRATED CIRCUIT (IC) (3DIC) TECHNOLOGY

(71) Applicant: QUALCOMM Incorporated, San Diego, CA (US)

(72) Inventor: Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/231,836

(22) Filed: Aug. 9, 2016

(65) Prior Publication Data

US 2016/0351553 A1 Dec. 1, 2016

Related U.S. Application Data

(63) Continuation of application No. 14/013,399, filed on Aug. 29, 2013, now Pat. No. 9,418,985.

(Continued)

(51) Int. Cl.
*H04Q 5/22* (2006.01)
*H01L 25/18* (2006.01)
*H01L 23/48* (2006.01)

(52) U.S. Cl.
CPC ............ *H01L 25/18* (2013.01); *H01L 23/481* (2013.01); *H01L 2225/06544* (2013.01)

(58) Field of Classification Search
CPC .................. H01L 25/18; H01L 23/481; H01L 2225/06544

(Continued)

(56) References Cited

U.S. PATENT DOCUMENTS

| 6,046,078 A | 4/2000 | So et al. |
| 7,692,448 B2 | 4/2010 | Solomon |

(Continued)

FOREIGN PATENT DOCUMENTS

| JP | 61131474 | 6/1986 |
| JP | 2004165269 A | 6/2004 |

(Continued)

OTHER PUBLICATIONS

Panth, Shreepad et al., "High-Density Integration of Functional Modules Using Monolithic 3D-IC Technology," 2013 18th Asia and South Pacific Design Automation Conference (ASP-DAC), Jan. 22-25, 2013, Yokohama, Japan, IEEE, pp. 681-686.

(Continued)

*Primary Examiner* — Ojiako Nwugo
(74) *Attorney, Agent, or Firm* — Withrow & Terranova, PLLC

(57) ABSTRACT

Embodiments disclosed in the detailed description include a complete system-on-chip (SOC) solution using monolithic three dimensional (3D) integrated circuit (IC) (3DIC) integration technology. The present disclosure includes example of the ability to customize layers within a monolithic 3DIC and the accompanying short interconnections possible between tiers through monolithic intertier vias (MIV) to create a system on a chip. In particular, different tiers of the 3DIC are constructed to support different functionality and comply with differing design criteria. Thus, the 3DIC can have an analog layer, layers with higher voltage threshold, layers with lower leakage current, layers of different material to implement components that need different base materials and the like. Unlike the stacked dies, the upper layers may be the same size as the lower layers because no external wiring connections are required.

20 Claims, 7 Drawing Sheets

Related U.S. Application Data

(60) Provisional application No. 61/846,648, filed on Jul. 16, 2013.

(58) Field of Classification Search
USPC ...... 340/10.1–10.5; 438/106, 121, 199, 627; 257/737, 751, 529, 209, 411
See application file for complete search history.

(56) References Cited

U.S. PATENT DOCUMENTS

| | | |
|---|---|---|
| 9,418,985 B2 | 8/2016 | Du |
| 2005/0139954 A1 | 6/2005 | Pyo |
| 2008/0003818 A1 | 1/2008 | Seidel et al. |
| 2009/0070727 A1 | 3/2009 | Solomon |
| 2010/0055507 A1 | 3/2010 | Morand |
| 2010/0259296 A1 | 10/2010 | Or-Bach |
| 2010/0289064 A1 | 11/2010 | Or-Bach et al. |
| 2011/0199116 A1 | 8/2011 | Or-Bach et al. |
| 2011/0215300 A1 | 9/2011 | Guo et al. |
| 2012/0161329 A1 | 6/2012 | Bobba et al. |
| 2012/0168933 A1 | 7/2012 | Lu et al. |
| 2012/0214305 A1 | 8/2012 | Radwan et al. |
| 2012/0299462 A1 | 11/2012 | Shi et al. |
| 2012/0313227 A1 | 12/2012 | Or-Bach et al. |
| 2013/0082235 A1 | 4/2013 | Gu et al. |
| 2013/0093091 A1 | 4/2013 | Ma et al. |
| 2014/0015136 A1 | 1/2014 | Gan et al. |
| 2014/0210040 A1 | 7/2014 | Filippi et al. |
| 2014/0268996 A1 | 9/2014 | Park |
| 2014/0269022 A1 | 9/2014 | Xie et al. |
| 2015/0022262 A1 | 1/2015 | Du |
| 2015/0035086 A1 | 2/2015 | Xie et al. |

FOREIGN PATENT DOCUMENTS

| | | |
|---|---|---|
| JP | 2007529894 A | 10/2007 |
| JP | 2012019018 A | 1/2012 |
| JP | 2012216776 A | 11/2012 |
| JP | 2013215917 A | 10/2013 |
| WO | 03010086 A2 | 2/2003 |
| WO | 03030252 A2 | 4/2003 |
| WO | 2005094240 A2 | 10/2005 |
| WO | 2013075007 A1 | 5/2013 |

OTHER PUBLICATIONS

Kie, Jing et al., "CPDI: Cross-Power-Domain Interface Circuit Design in Monolithic 3D Technology," 2013 14th International Symposium on Quality Electronic Design (ISQED), Mar. 4-6, 2013, Santa Clara, CA, IEEE, pp. 442-447.
International Search Report and Written Opinion for PCT/US2014/046503, mailed Nov. 13, 2014, 14 pages.
Second Written Opinion for PCT/US2014/046503, mailed Jun. 26, 2015, 7 pages.
International Preliminary Report on Patentability for PCT/US2014/046503, mailed Oct. 13, 2015, 20 pages.
First Office Action for Japanese Patent Application No. 2016-527009, mailed Nov. 1, 2016, 6 pages.

COMPLETE SYSTEM-ON-CHIP (SOC) USING MONOLITHIC THREE DIMENSIONAL (3D) INTEGRATED CIRCUIT (IC) (3DIC) TECHNOLOGY

PRIORITY APPLICATIONS

The present application is a continuation of and claims priority under 35 U.S.C. §120 to U.S. patent application Ser. No. 14/013,399, filed on Aug. 29, 2013, now U.S. Pat. No. 9,418,985, and entitled "COMPLETE SYSTEM-ON-CHIP (SOC) USING MONOLITHIC THREE DIMENSIONAL (3D) INTEGRATED CIRCUIT (IC) (3DIC) TECHNOLOGY," which is incorporated herein by reference in its entirety.

The '399 application claims priority under 35 U.S.C. §119(e) to U.S. Provisional Patent Application Ser. No. 61/846,648 filed on Jul. 16, 2013 and entitled "COMPLETE SYSTEM-ON-CHIP (SOC) USING MONOLITHIC THREE DIMENSIONAL (3D) INTEGRATED CIRCUIT (IC) (3DIC) TECHNOLOGY," which is incorporated herein by reference in its entirety.

BACKGROUND

I. Field of the Disclosure

The technology of the disclosure relates generally to system-on-chip (SOC) integrated circuits (ICs).

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. The limited space contributes pressure to a continued miniaturization of components and power consumption within the circuitry. While miniaturization has been of particular concern in the integrated circuits (ICs) of mobile communication devices, efforts at miniaturization of ICs in other devices have also proceeded.

Increasing efforts have been made in miniaturizing digital components and squeezing ever more digital functions into a single integrated circuit (IC). However, to date, it has proven difficult to include both analog and digital components within a single IC such as, for example, when designing a radio frequency (RF) transceiver and signal processing element for a cellular telephone or other mobile communication device. Likewise, even within the same side of the digital/analog coin it can sometimes be difficult to incorporate components having disparate physical requirements into a single IC. For example, elements having a high speed requirement may be difficult to integrate into the same chip with elements requiring low current leakage. This difficulty in uniting such elements into a single chip has made true system-on-chip (SOC) solutions impractical. In most devices, an analog chip is created and electrically coupled to a digital chip. The coupling requires electrical conductors and results in a severe area penalty as space within the device is devoted to these conductors. The use of such space for conductors conflicts with the general miniaturization goals.

One compromise solution to these competing design criteria has been die stacking designs or other system in package (SIP) arrangements. In such die stacking arrangements, a digital die is stacked on top of an analog die or vice versa. However, space is still spent intercoupling the dies. Likewise, the upper die is usually smaller than the bottom die forming a shape like a ziggurat. While there are commercial implementations that have as many as three dies stacked on one another, these implementations do not have substantial space savings. Thus, there remains need for a truly integrated SOC.

SUMMARY OF THE DISCLOSURE

Embodiments disclosed in the detailed description include a complete system-on-chip solution using monolithic three dimensional (3D) integrated circuit (IC) (3DIC) integration technology. The present disclosure includes examples of the ability to customize layers within a monolithic 3DIC and the accompanying short interconnections possible between tiers through monolithic intertier vias (MIV) to create a "system on a chip" or "system-on-chip" both referred to as (SOC). In particular, different tiers of the 3DIC are constructed to support different functionality and comply with differing design criteria. Thus, the 3DIC can have one or more analog layers, digital layers, layers with higher voltage threshold, layers with lower leakage current, power supply layers, layers of different material to implement components that need different base materials and the like. Unlike the stacked dies of system in package (SIP) arrangements, the upper layers may be the same size as the lower layers because no external wiring connections are required. By having the myriad layers within a single 3DIC, an entire system may be provided in a single IC and thus provide a SOC.

In this regard in one embodiment, a monolithic 3DIC system is provided. The monolithic 3DIC system comprises a plurality of tiers positioned one on top of another. The system also comprises a plurality of functional elements selected from the group consisting of: computation, digital processing, analog processing, radio frequency (RF) signal processing, analog/mixed signal processing, power management, sensor, power supply, battery, memory, digital logic, low leakage, low noise/high gain, clock, combinatorial logic, and sequential logic. The system also comprises the plurality of functional elements distributed amongst the plurality of tiers. The system also comprises a plurality of MIV electrically coupling the plurality of tiers. The system also comprises the plurality of functional elements providing a complete self-contained SOC.

In another embodiment, a monolithic 3DIC system is disclosed. The monolithic 3DIC system comprises a plurality of tiers positioned one on top of another. The system also includes means for providing a plurality of functions selected from the group consisting of: computation, digital processing, analog processing, RF signal processing, analog/mixed signal processing, power management, sensor, power supply, battery, memory, digital logic, low leakage, low noise/high gain, clock, combinatorial logic, and sequential logic. The system also includes the means for providing the plurality of functions distributed amongst the plurality of tiers. The system also includes means to electrically intercouple the plurality of tiers. The system also includes the means for providing the plurality of functions providing a complete self-contained SOC.

In another embodiment, a method of implementing a 3DIC system is disclosed. The method includes providing a plurality of tiers within the 3DIC. The method also includes providing multiple functional elements across the plurality of tiers. The method also includes intercoupling the plurality of tiers using MIV. The method also includes providing a complete self-contained SOC with the 3DIC.

DETAILED DESCRIPTION

Figure 1:
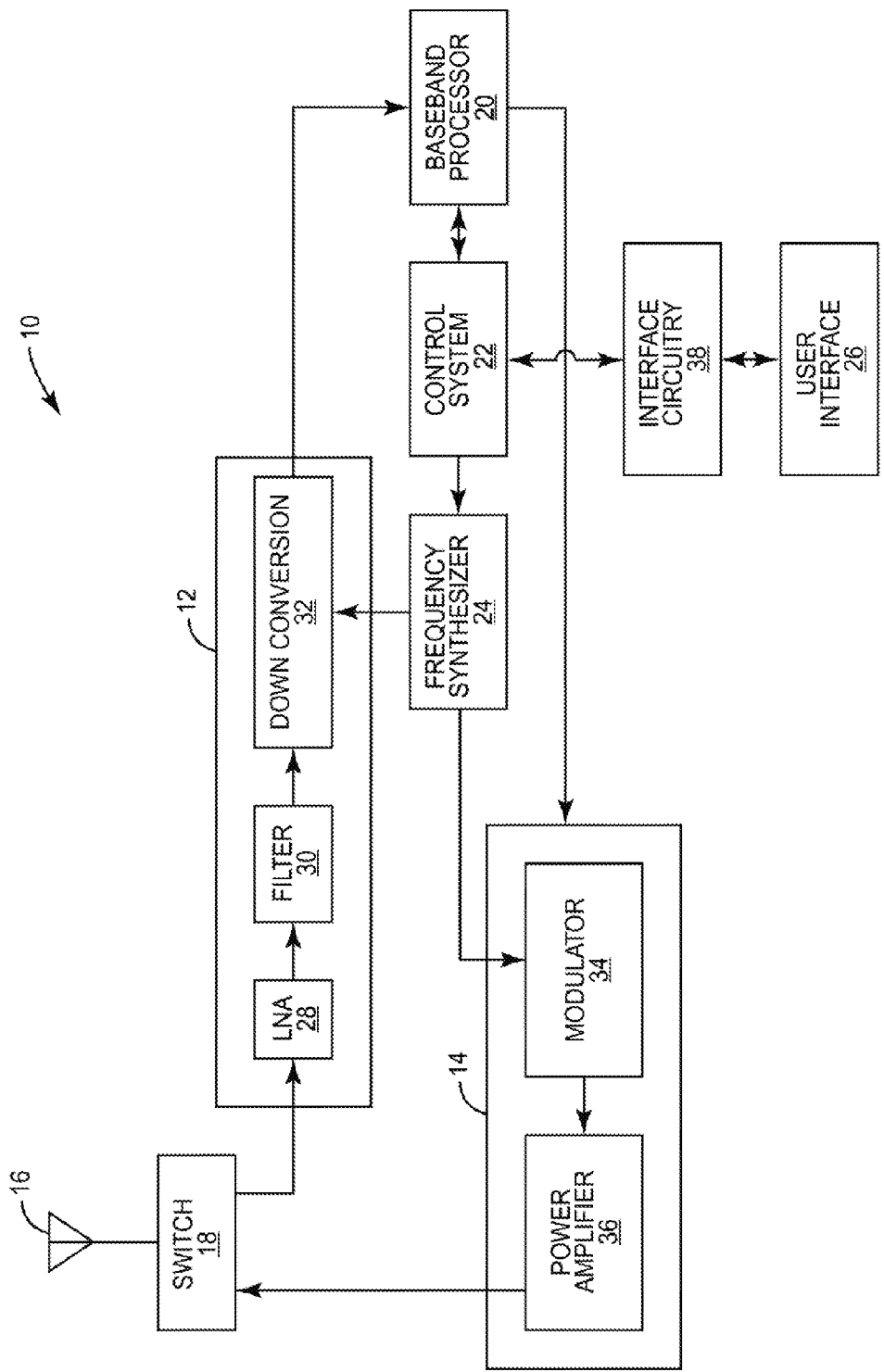
FIG. 1 is a block diagram of a conventional mobile terminal which uses integrated circuits (ICs) therein.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include a complete system-on-chip solution using monolithic three dimensional (3D) integrated circuit (IC) (3DIC) integration technology. The present disclosure includes examples of the ability to customize layers within a monolithic 3DIC and the accompanying short interconnections possible between tiers through monolithic intertier vias (MIV) to create a "system on a chip" or "system-on-chip" both referred to as (SOC). In particular, different tiers of the 3DIC are constructed to support different functionality and comply with differing design criteria. Thus, the 3DIC can have one or more analog layers, digital layers, layers with higher voltage threshold, layers with lower leakage current, power supply layers, layers of different material to implement components that need different base materials and the like. Unlike the stacked dies of system in package (SIP) arrangements, the upper layers may be the same size as the lower layers because no external wiring connections are required. By having the myriad layers within a single 3DIC, an entire system may be provided in a single IC and thus provide a SOC.

Figure 2:
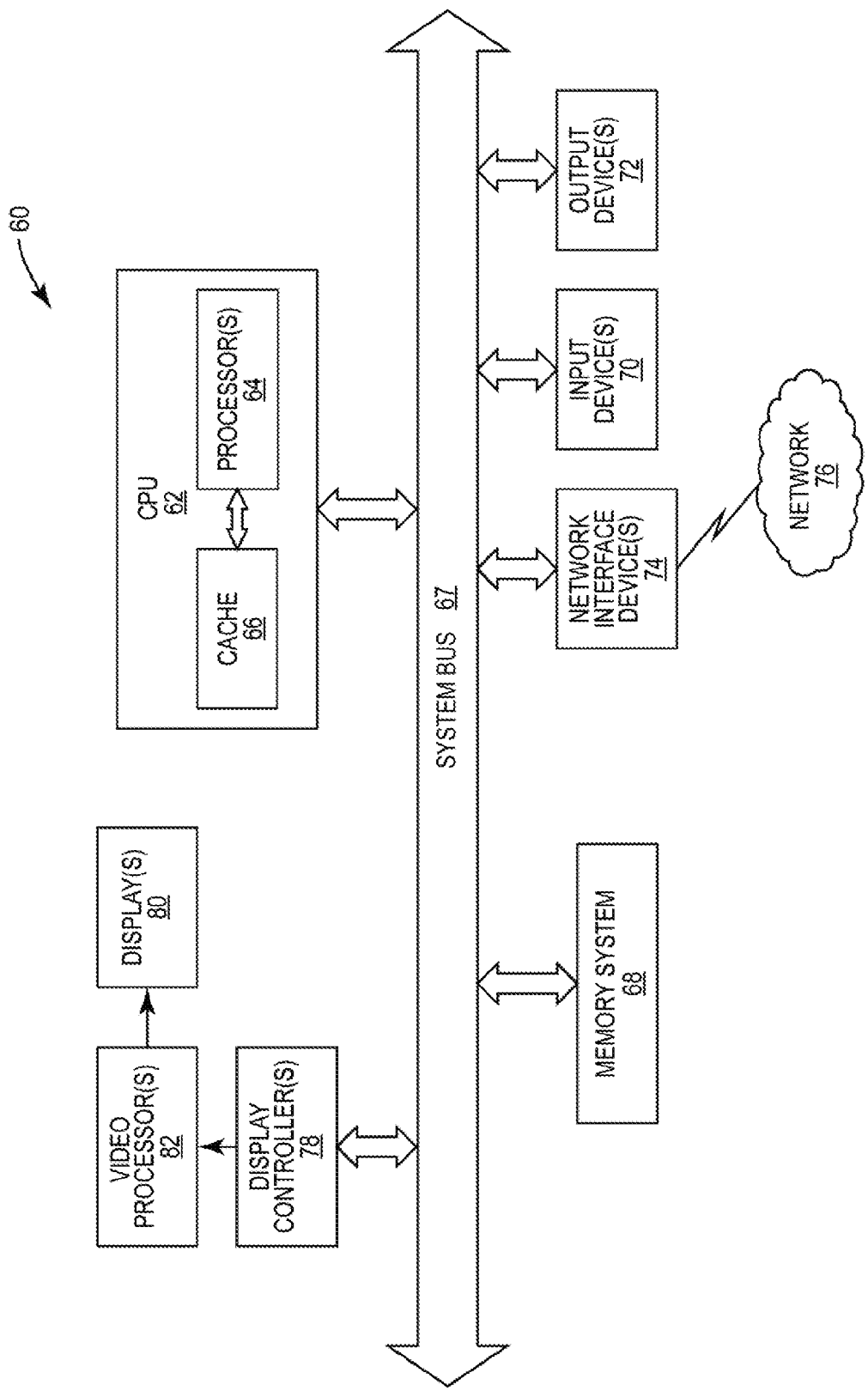
FIG. 2 is a block diagram of a conventional computing device which uses ICs therein.
Figure 3:
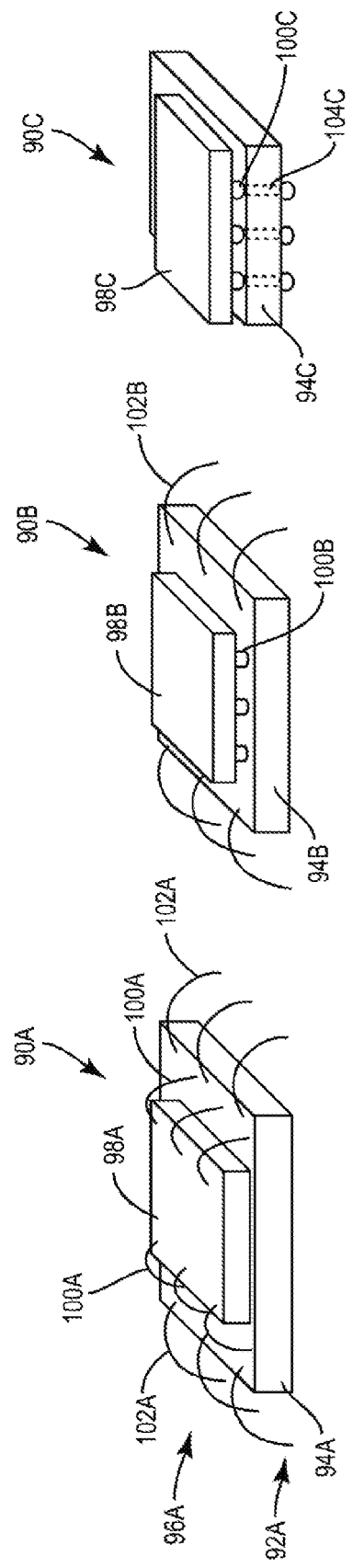
FIGS. 3A-3C are perspective views of exemplary conventional die stacking efforts that create a system in a package (SIP)

Before addressing the particulars of the present disclosure a brief description of conventional devices that may benefit from the SOC advances proposed herein is provided. In this regard, FIGS. 1 and 2 illustrate conventional devices that use multiple ICs to effectuate desired functionality. FIGS. 3A-3C illustrate SIP solutions that are currently used in some of conventional devices. Discussion of embodiments of the present disclosure begins below with reference to FIG. 4.

There are many devices that currently use multiple ICs to implement functionality. Only a few are illustrated herein, but it should be appreciated that the present disclosure is applicable to devices beyond those illustrated herein. In this regard, FIG. 1 illustrates a conventional radio frequency (RF) mobile terminal 10. Mobile terminals are common such as cellular telephones, smart phones, pagers, and the like. The mobile terminal 10 may include a receiver 12, a transmitter 14, an antenna 16, a switch 18, a baseband processor 20, a control system 22, a frequency synthesizer 24, and a user interface 26.

The receiver 12 receives information bearing RF signal from one or more remote transmitters provided by a base station (not shown). A low noise amplifier (LNA) 28 amplifies the signal. Filter 30 minimizes broadband interference in the received signal, while down conversion and digitization circuitry 32 down converts the filtered, received signal to an intermediate or baseband frequency signal, which is then digitized into one or more digital streams. The receiver 12 typically uses one or more mixing frequencies generated by the frequency synthesizer 24. The baseband processor 20 processes the digitized received signal to extract the information or data bits conveyed in the signal. As such, the baseband processor 20 is typically implemented in one or more digital signal processors (DSPs).

With continued reference to FIG. 1, on the transmit side, the baseband processor 20 receives digitized data, which may represent voice, data, or control information, from the control system 22, which it encodes for transmission. The encoded data is output to the RF transmitter 14, where it is used by a modulator 34 to modulate a carrier signal at a desired transmit frequency. RF power amplifier 36 amplifies the modulated carrier signal to a level appropriate for transmission, and delivers the amplified and modulated carrier signal to the antenna 16 through the switch 18.

With continued reference to FIG. 1, a user may interact with the mobile terminal 10 via the user interface 26, which may include interface circuitry 38 associated with a microphone, a speaker, a keypad, and a display. The interface circuitry 38 typically includes analog-to-digital converters, digital-to-analog converters, amplifiers, and the like. Additionally, it may include a voice encoder/decoder, in which case it may communicate directly with the baseband processor 20. Audio information encoded in the received signal is recovered by the baseband processor 20, and converted by the interface circuitry 38 into an analog signal suitable for driving the speaker. The keypad and display enable the user to interact with the mobile terminal 10. For example, the keypad and display may enable the user to input numbers to be dialed, access address book information, or the like, as well as monitor call progress information.

In practice, the mobile terminal 10 may have one or more ICs for different functions of the mobile terminal 10. For example, the switch 18 may be one IC, the receiver 12 another IC, the baseband processor 20 a third IC, the transmitter 14 a fourth IC, and the interface circuitry 38 a fifth IC. The various ICs may be designed to analog, digital, or otherwise have seemingly incompatible technology types disposed on the respective ICs. If these various ICs are arranged in a two dimensional layout as is common, the amount of wiring required to interconnect the various ICs requires a large volume of space, which contradicts the miniaturization goals of the industry.

Turning to FIG. 2, which illustrates an example of a processor-based system 60. The processor-based system 60 includes one or more central processing units (CPUs) 62, each including one or more processors 64. The CPU(s) 62 may have cache memory 66 coupled to the processor(s) 64 for rapid access to temporarily stored data. The CPU(s) 62 is coupled to a system bus 67 and can intercouple devices included in the processor-based system 60. As is well known, the CPU(s) 62 communicates with these other devices by exchanging address, control, and data information over the system bus 67.

With continued reference to FIG. 2, the CPU(s) 62 may communicate with these other devices including a memory system 68, one or more input devices 70, one or more output devices 72, one or more network interface devices 74, and one or more display controllers 78, as examples. The input device(s) 70 can include any type of input device, including but not limited to input keys, switches, voice processors, etc. The output device(s) 72 can include any type of output device, including but not limited to audio, video, other visual indicators, etc. The network interface device(s) 74 can be any devices configured to allow exchange of data to and from a network 76. The network 76 can be any type of network, including but not limited to a wired or wireless network, private or public network, a local area network (LAN), a wide local area network (WLAN), and the Internet. The network interface device(s) 74 can be configured to support any type of communication protocol desired.

The CPU(s) 62 may also be configured to access the display controller(s) 78 over the system bus 67 to control information sent to one or more displays 80. The display controller(s) 78 sends information to the display(s) 80 to be displayed via one or more video processors 82, which process the information to be displayed into a format suitable for the display(s) 80. The display(s) 80 can include any type of display, including but not limited to a cathode ray tube (CRT), a liquid crystal display (LCD), a plasma display, etc.

Again, it should be appreciated that many of the functional blocks of FIG. 2 may be embodied in separate ICs. Each of these ICs has its own connections to the printed circuit board (PCB) of the device as well as wiring connections to allow communication to other ICs in the device. As noted above, the presence of the many wiring connections consumes space within the device and is otherwise undesirable.

As noted above, only two devices are illustrated in FIGS. 1 and 2, but it should be appreciated that there are many processor-based devices which may benefit from embodiments of the present disclosure including, without limitation, a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Conventional efforts to minimize the space consumed by the plurality of ICs in such devices has heretofore focused on SIP arrangements. That is the number of ICs is preserved, but stacked into a package. Three such stacking arrangements are provided with reference to FIGS. 3A-3C. The individual and separate ICs are preserved because of the difficulty experienced in integrating different technologies within a single IC. For example, fabrication techniques differ greatly between analog and digital components and accordingly, it is difficult to include both components in a single IC. Likewise, fabrication techniques to support high speed circuitry are different than those techniques used to provide low current leakage, and it is difficult to include both types of components in a single IC. In short, there are many conflicting technology requirements to achieve different functions within an IC.

In this regard, FIG. 3A illustrates a die stacked system 90A. The die stacked system 90A has a first layer 92A formed from a first IC 94A and a second layer 96A formed from a second IC 98A. This arrangement is sometimes referred to as a wireless bond in that there is no direct wire connection between the first IC 94A and the second IC 98A. The first IC 94A is intercoupled to the second IC 98A with external wiring 100A. To accommodate the external wiring 100A, the second layer 96A is smaller than the first layer 92A. Likewise, the first IC 94A is coupled to other elements within a device (not shown) by external wiring 102A. The need for external wiring 100A and 102A expands the area required to implement the die stacked system 90A. Likewise, the existence of the external wiring 100A and the corresponding smaller area of second layer 96A means that fewer options are available for components within second IC 98A. Alternatively, if elements within the second IC 98A are of a certain size, then the first layer 92A must be correspondingly larger, even if the elements within the first IC 94A do not require all that area. In short, the die stacked system 90A is not an optimal solution for providing a full system and is specifically defined to not be a SOC solution as used herein.

With reference to FIG. 3B, die stacked system 90B is similar to die stacked system 90A, but instead of external wiring 100A, solder bumps 100B are used to interconnect first IC 94B with second IC 98B. This arrangement is sometimes referred to as a flip-chip arrangement. Face to face bonding is achieved, but only for two layers. If more than two layers are used, the external wiring (such as that used in FIG. 3A) is required. However, even with just two layers, external wiring 102B is still present to interconnect the die stacked system 90B to other elements within the device. The positioning of external wiring 102B on the upper surface of the first IC 94B forces the second IC 98B to be smaller than the first IC 94B with the same disadvantages just discussed. Again, such a die stacked arrangement is specifically defined to not be a SOC as used herein.

With reference to FIG. 3C, die stacked system 90C is likewise similar to die stacked systems 90A, 90B, but instead of external wiring 100A, solder bumps 100C intercouple the first IC 94C with the second IC 98C. Likewise, vias 104C (which may be through silicon vias (TSV)) extend through the first IC 94C. TSV are typically fairly large (e.g. ~microns) and correspondingly impose a large area penalty as wiring within the first IC 94C must be routed around the TSV. This routing and requirements for space for active components again force first IC 94C to be larger than the second IC 98C. Again, such a die stacked arrangement is specifically defined to not be a SOC as used herein.

With each of the die stacking systems 90A-90C, there may be undesirable crosstalk to other electromagnetic interference (EMI) leading to the potential failure of delicate analog and/or RF signal processing units. Likewise, the relatively large chip size causes high yield loss and creates other packaging challenges.

In contrast to the size penalties and other disadvantages of SIP, the present disclosure provides a true single chip SOC using monolithic 3DIC technology. Thus, a SOC may be made from a single 3DIC having heterogeneous functions across multiple tiers within the 3DIC. Some functions may be collocated within a single tier while some functions may be spread across multiple tiers. Thus, the SOC of the present disclosure allows heterogeneous partitioning of system functions in different tiers of different technologies or flavors, heterogeneously partitioning circuit functions in different tiers of different technologies or flavors, and homogeneously partitioning different functions in different tiers of different technologies or flavors.

Figure 4:
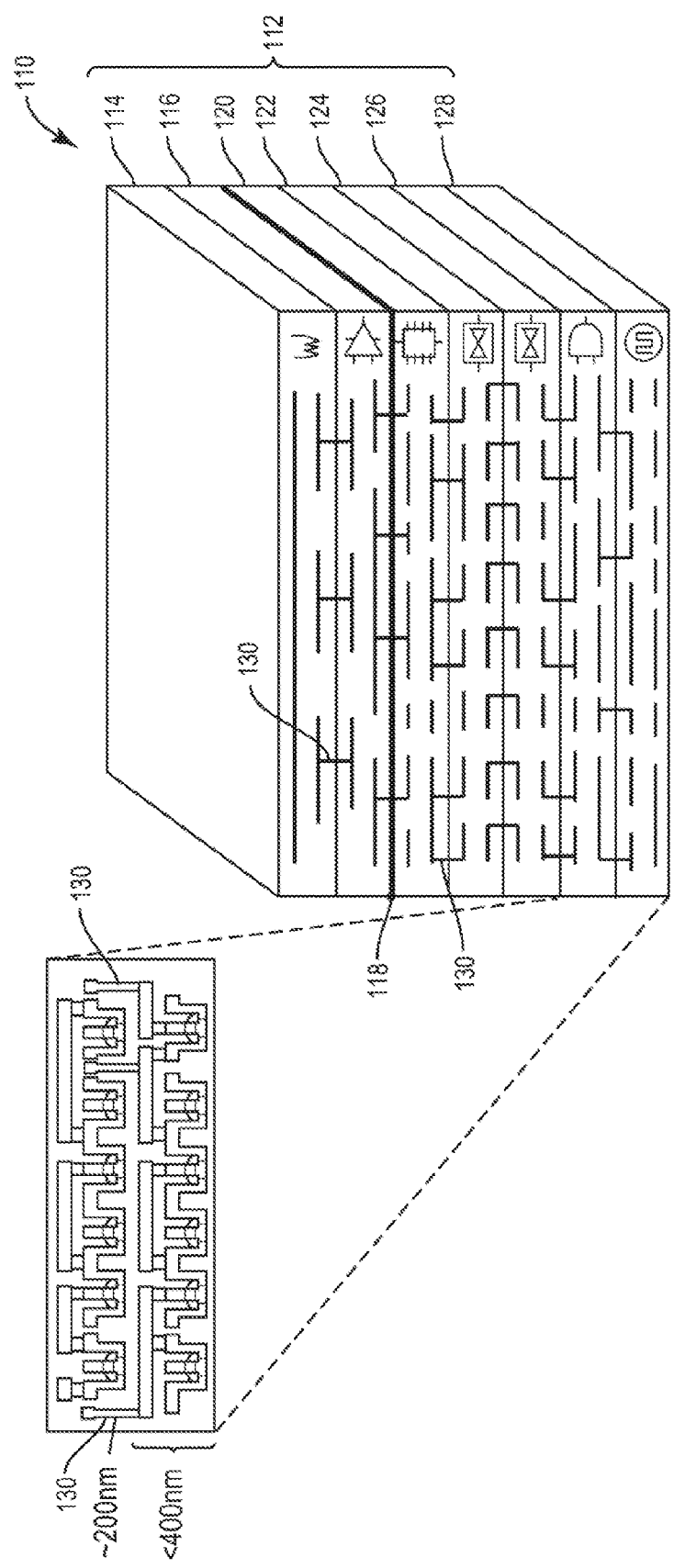
FIG. 4 is a side elevational view of a three dimensional (3D) integrated circuit (IC) (3DIC) system-on-chip (SOC) according to an exemplary embodiment of the present disclosure.

In this regard, FIG. 4 illustrates a simplified cross-section of a 3DIC SOC 110. The 3DIC SOC 110 has multiple tiers 112. The tiers 112 may be formed by hydrogen cutting or other monolithic tier formation method. For more information on an exemplary hydrogen cutting process, the interested reader is referred to U.S. patent application Ser. No. 13/765,080, filed Feb. 12, 2013, which is herein incorporated by reference in its entirety.

As noted above, the use of 3DIC technology allows different tiers of the tiers 112 within the 3DIC SOC 110 to perform different functions and provide all the functions of a particular device in a single 3DIC SOC 110. For example, the 3DIC SOC 110 may be a RF transceiver and controller for a mobile terminal such as mobile terminal 10 described above with reference to FIG. 1. Thus, a first tier 114 includes sensors and other large feature size elements.

With continued reference to FIG. 4, a second tier 116 may include radio frequency, analog and/or power management integrated circuit (PMIC) components such as the receiver 12, transmitter 14 and duplexer/switch 18. The second tier 116 may be designed to be relatively low noise so that incoming RF analog signals are not distorted.

With continued reference to FIG. 4, an electromagnetic (EM) shield 118 may be positioned between the second tier 116 and a third tier 120. The EM shield 118 may be formed from a conductive material such as a graphene layer. For more information about graphene shields in 3DIC, the interested reader is referred to U.S. patent application Ser. No. 13/765,061, filed Feb. 12, 2013, the disclosure of which is herein incorporated by reference in its entirety.

The presence of the EM shield 118 helps prevent noise from the first and second tiers 114, 116 from affecting the low noise characteristics of the third tier 120. The third tier 120 may have a modem or other controller. To accommodate the functions on the third tier 120, the materials and design of the third tier 120 may be selected to promote a medium speed architecture.

With continued reference to FIG. 4, fourth and fifth tiers 122, 124 may be a memory bitcell array with random access memory (RAM) including dynamic RAM (DRAM), static RAM (SRAM) or the like. Both tiers 122, 124 may be designed to provide low leakage circuitry to improve the operation of the RAM.

With continued reference to FIG. 4, sixth and seventh tiers 126, 128 may be general processing unit tiers. Sixth tier 126 may include a digital signal processor (DSP) such as baseband processor 20 (FIG. 1) using combination logic while seventh tier 128 may include a DSP relying on sequential logic. Both tiers 126, 128 may be designed to support high speeds over concerns about leakage.

In an exemplary embodiment, the tiers are electrically intercoupled by MIV 130. For more information about MIV, the interested reader is referred to "High-Density Integration of Functional Modules Using Monolithic 3D-IC Technology" by Shreedpad Panth et al. in the proceedings of the IEEE/ACM Asia South Pacific Design Automation Conference, 2013; pp. 681-686 which is hereby incorporated by reference in its entirety. In contrast to TSV, MIV may be on the order of sub 100 nm in diameter (i.e., much smaller than the micron dimensions of the TSV) and 200 nm or less depth. Further, in an exemplary embodiment, each of the multiple tiers 112 may be approximately 400 nm thick or thinner. These dimensions are illustrated in the inset of FIG. 4.

By providing different tiers with different functions and/or being able to split circuits across different tiers, a full system IC is possible including batteries, sensors, memory, energy harvesting functions, PMIC, processors, digital and analog components, and the like. Each tier may be optimized to accommodate the functions positioned thereon. Additionally, the very high density of tier to tier links (i.e., the MIV) allows a high degree of wafer level integration. The 3DIC SOC may have a homogeneous cell level 3D partition—sequential-combination logic, multi-tier memory bitcell arrays. Likewise, the 3DIC SOC may have a fine grain heterogeneous 3D partition such as a memory to digital core, bitcell array-control logic partitions. This flexibility allows for a wide range of technology features for optimal system functions.

Figure 6:
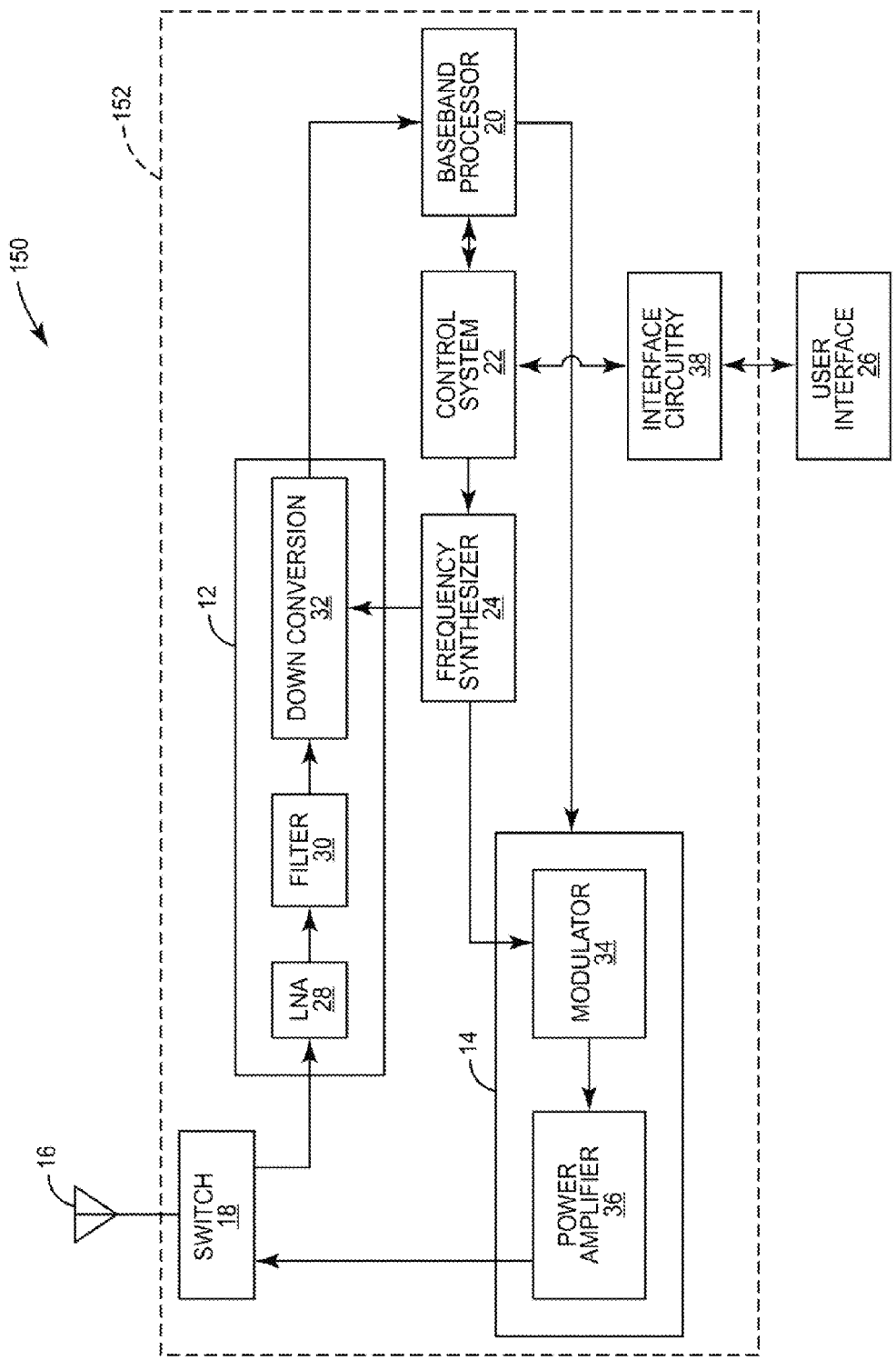
FIG. 6 is a block diagram of a mobile terminal having a 3DIC SOC therein.

As noted above, in an exemplary embodiment, the 3DIC SOC may be a complete RF transceiver and baseband processor all in one IC as illustrated in FIG. 6. In particular, FIG. 6 illustrates a mobile terminal 150 similar to mobile terminal 10, except the circuit elements of the mobile terminal 150 are contained within a single 3DIC 152. Antenna 16 and user interface 26 are distinct from the 3DIC 152, although it is possible to incorporate an antenna into a 3DIC if desired. The functions of the circuit elements remain the same and thus are referenced using the same numbers. Likewise, a control system having a processor, battery, and memory may be in a single 3DIC SOC. Such 3DIC SOC allow for space saving designs while still allowing superior system performance because the individual tiers are tailored to the functions positioned thereon. The use of shields or other isolation techniques allow for improved signal isolation. Further, there is overall reduced complexity in that no external wiring connections are required between different layers or different IC. In an exemplary embodiment, the total 3DIC SOC may be sub one $mm^3$.

Figure 7:
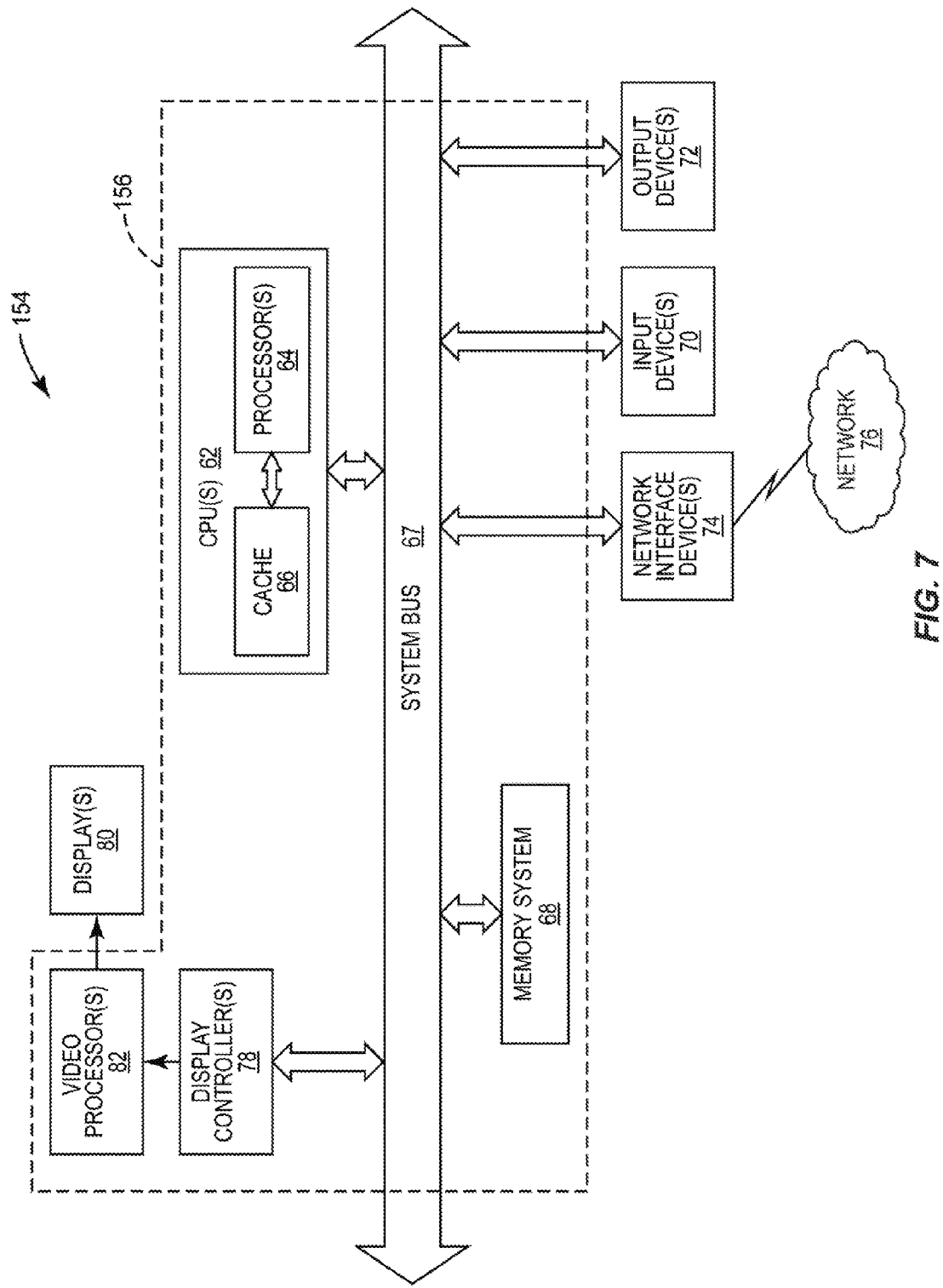
FIG. 7 is a block diagram of a computing device having a 3DIC SOC therein.

With reference to FIG. 7, a processor-based system 154 similar to processor-based system 60 may include a single 3DIC 156 incorporating the circuit elements of the processor-based system. The functions of the circuit elements remain the same and thus are referenced using the same numbers.

As mentioned above, one of the other benefits of providing a 3DIC 110 with multiple tiers 112 is that the operating characteristics of a particular tier may be tailored to a particular need or desire. Such operating characteristics may be effectuated by using different materials (e.g., Si versus GaAs) or by using different types of masks to change parameters like internal latency or memory current leakage. An exemplary summary of parameters or characteristics and how they change the operational profile of the memory is provided in TABLE 1 below. For example, a transistor characteristic(s) of memory cell transistors of a memory portion(s) may be modified to tradeoff increased internal latency for reduced current leakage. In this regard, TABLE 1 below illustrates various transistor characteristics, which may be modified to affect the current leakage and internal latency of the memory portion(s). TABLE 1 illustrates effects of modifying memory cell transistor channel length (L), memory cell transistor channel width (W), and memory cell transistor threshold voltage (Vt). In addition, TABLE 1 illustrates effects of selecting among HVt, NVt, or LVt memory cell transistors to provide the memory portion(s). TABLE 1 also illustrates the effects of biasing the body (B) terminal of the memory cell transistors. TABLE 1 illustrates various effects of modifying the above-mentioned characteristics, including: whether the modification increases (+) or decreases (−) drain-source conductance ($G_{DS}$) of the induced channels of the memory cell transistors of the memory portion(s); whether the modification increases (+) or decreases (−) drain-source resistance ($R_{DS}$) of the induced channels of the memory cell transistors of the memory portion(s); whether the modification increases (+) or decreases (−) current leakage of the memory portion(s); and whether the modification increases (+) or decreases (−) internal latency of the memory portion(s).

TABLE 1

Exemplary Effects of Modifying Memory Cell Transistor Characteristics

| Transistor characteristic | Modification | Effect of Modification | | | |
|---|---|---|---|---|---|
| | | $G_{DS}$ | $R_{DS}$ | memory current leakage | internal latency of memory |
| channel length (L) | shorter length | + | − | + | − |
| | longer length | − | + | − | + |
| channel width (W) | shorter width | − | + | − | + |
| | longer width | + | − | + | − |
| threshold voltage (Vt) | higher | − | + | − | + |
| | lower | + | − | + | − |
| HVt, NVt, LVt | HVt | − | + | − | + |
| | NVt | nominal | nominal | nominal | nominal |
| | LVt | + | − | + | − |
| Bias | Set $V_B < V_S$ (increases Vt) | − | + | − | + |
| | $V_B = V_S$ | nominal | nominal | nominal | nominal |
| | Set $V_B > V_S$ (decreases Vt) | + | − | + | − |

Figure 5:
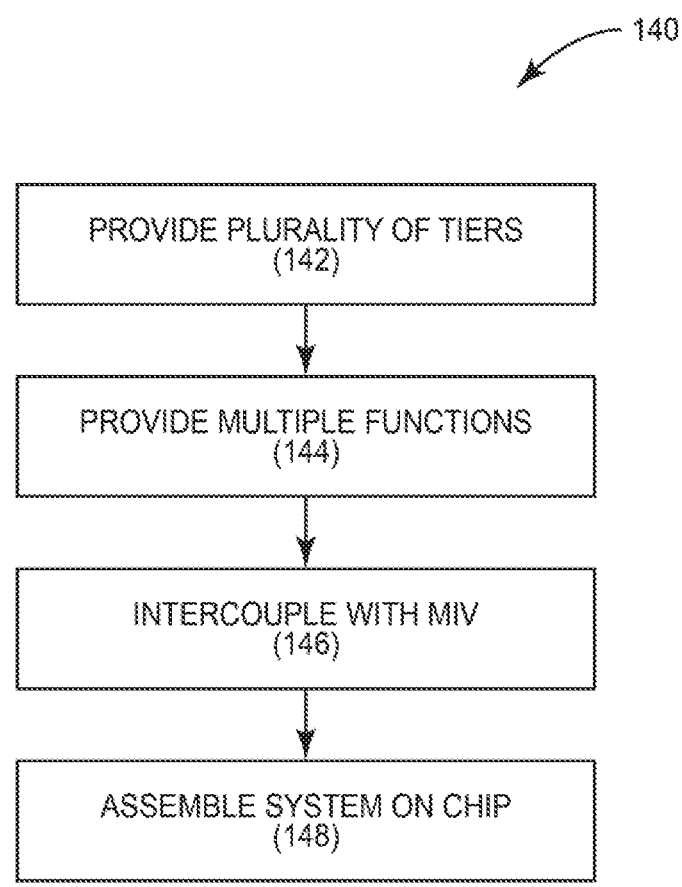
FIG. 5 is a flowchart illustrating an exemplary process for designing a 3DIC SOC.

In an exemplary embodiment, a method of implementing a 3DIC is illustrated in FIG. 5 by process 140. The process starts by providing a plurality of tiers 112 (block 142). The process continues by providing multiple functional elements across the tiers 112 (block 144). The process continues by intercoupling the tiers using MIV 130 (block 146). The multiple tiers 112 and multiple functions with the MIV 130 intercoupling thus form a SOC 110 (block 148).

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A monolithic three dimensional (3D) integrated circuit (IC) (3DIC) system, comprising:
    a plurality of tiers positioned one on top of another;
    a plurality of functional elements selected from the group consisting of:
        computation, digital processing, analog processing, radio frequency (RF) signal processing, analog/mixed signal processing, power management, sensor, power supply, battery, memory, digital logic, low leakage, low noise/high gain, clock, combinatorial logic, and sequential logic;
    the plurality of functional elements distributed amongst the plurality of tiers; and
    a plurality of monolithic intertier vias (MIV) electrically coupling the plurality of tiers;
    the plurality of functional elements providing a self-contained system on a chip (SOC).

2. The monolithic 3DIC system of claim 1, wherein each of the plurality of tiers has identical horizontal dimensions.

3. The monolithic 3DIC system of claim 1, wherein at least one tier of the plurality of tiers is optimized for high speed operation.

4. The monolithic 3DIC system of claim 1, wherein at least one tier of the plurality of tiers is optimized for low current leakage.

5. The monolithic 3DIC system of claim 1, wherein different ones of the plurality of functional elements are positioned on different ones of the plurality of tiers.

6. The monolithic 3DIC system of claim 1, wherein a first tier of the plurality of tiers comprises a first technology type configured to optimize a first function from the group.

7. The monolithic 3DIC system of claim 6, wherein a second tier of the plurality of tiers comprises a second technology type configured to optimize a second function from the group.

8. The monolithic 3DIC system of claim 1, wherein the plurality of tiers further comprises a third tier.

9. The monolithic 3DIC system of claim 1, wherein the monolithic 3DIC system operates as a RF transceiver.

10. The monolithic 3DIC of claim 1, further comprising a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the IC is integrated.

11. A monolithic three dimensional (3D) integrated circuit (IC) (3DIC) system, comprising:
    a plurality of tiers positioned one on top of another;
    means for providing a plurality of functions selected from the group consisting of: computation, digital processing, analog processing, radio frequency (RF) signal processing, analog/mixed signal processing, power management, sensor, power supply, battery, memory, digital logic, low leakage, low noise/high gain, clock, combinatorial logic, and sequential logic;
    the means for providing the plurality of functions distributed amongst the plurality of tiers; and means to electrically intercouple the plurality of tiers;

the means for providing the plurality of functions providing a self-contained system on a chip (SOC).

12. The monolithic 3DIC system of claim 11, wherein the means to electrically intercouple the plurality of tiers comprise monolithic intertier vias (MIV).

13. The monolithic 3DIC system of claim 11, wherein the monolithic 3DIC system operates as a RF transceiver.

14. A method of implementing a three dimensional (3D) integrated circuit (IC) (3DIC) system, comprising:

providing a plurality of tiers within the 3DIC;

providing multiple functional elements across the plurality of tiers;

intercoupling the plurality of tiers using monolithic intertier vias (MIV); and providing a self-contained system on a chip (SOC) with the 3DIC.

15. The method of claim 14, wherein providing the plurality of tiers comprises a plurality of tiers having identical horizontal dimensions.

16. The method of claim 14, wherein providing the plurality of tiers comprises providing at least one tier optimized for high speed operation.

17. The method of claim 14, wherein providing the plurality of tiers comprises providing at least one tier optimized for low current leakage.

18. The method of claim 14, wherein different ones of the multiple functional elements are positioned on different ones of the plurality of tiers.

19. The method of claim 14, wherein a first tier of the plurality of tiers comprises a first technology type configured to optimize a first function.

20. The method of claim 19, wherein a second tier of the plurality of tiers comprises a second technology type configured to optimize a second function.

* * * * *